(12) United States Patent
Yeh et al.

(10) Patent No.: US 9,601,333 B2
(45) Date of Patent: Mar. 21, 2017

(54) ETCHING PROCESS

(71) Applicant: Taiwan Semiconductor Manufacturing Company, Ltd., Hsin-Chu (TW)

(72) Inventors: Ming-Hsi Yeh, Hsinchu (TW); Yih-Ann Lin, Hsinchu County (TW); Bi-Ming Yen, Hsin-chu (TW); Chao-Cheng Chen, Hsin-chu (TW); Syun-Ming Jang, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/505,064

(22) Filed: Oct. 2, 2014

(65) Prior Publication Data
US 2016/0099151 A1    Apr. 7, 2016

(51) Int. Cl.
H01L 29/66    (2006.01)
H01L 21/324   (2006.01)
H01L 21/225   (2006.01)
H01L 21/311   (2006.01)
H01L 21/02    (2006.01)

(52) U.S. Cl.
CPC .... *H01L 21/2256* (2013.01); *H01L 21/31111* (2013.01); *H01L 21/31144* (2013.01); *H01L 21/324* (2013.01); *H01L 29/66795* (2013.01); *H01L 21/0212* (2013.01); *H01L 21/02118* (2013.01); *H01L 21/02274* (2013.01); *H01L 21/31138* (2013.01)

(58) Field of Classification Search
CPC ............... H01L 21/3205; H01L 21/467; H01L 21/4763; H01L 27/15; H01L 33/28; H01L 21/225; H01L 21/311; H01L 21/324; H01L 21/31111; H01L 21/31144; H01L 29/66; H01L 29/66795
See application file for complete search history.

(56) References Cited

U.S. PATENT DOCUMENTS 6,812,105 B1 * 11/2004 Dokumaci .......... H01L 29/6656
257/E21.415
2002/0014403 A1 * 2/2002 Hoshino ................ B82Y 10/00
204/192.32

(Continued)

FOREIGN PATENT DOCUMENTS

KR   10-2010-0070937    6/2010
KR   10-2014-0043270    4/2014

OTHER PUBLICATIONS

KIPO, Office Action, Serial No. 10-2014-0182401, Filed Dec. 17, 2014, 8 pgs. with Translation.

*Primary Examiner* — Benjamin Sandvik
*Assistant Examiner* — Fazli Erdem
(74) *Attorney, Agent, or Firm* — Haynes and Boone, LLP

(57) ABSTRACT

A method includes providing a semiconductor substrate; forming a doping oxide layer on the semiconductor substrate; forming a patterning layer on the doping oxide layer, the patterning layer leaving exposed regions of the doping oxide layer; performing a sputtering process to the substrate; and after the sputtering process, performing a wet etching process to the semiconductor substrate to remove the doping oxide layer from the exposed regions.

20 Claims, 7 Drawing Sheets

(56) References Cited

U.S. PATENT DOCUMENTS

| | | | |
|---|---|---|---|
| 2005/0042859 A1* | 2/2005 | Yu | H01L 21/31144 438/636 |
| 2005/0127417 A1* | 6/2005 | Saenger | H01L 21/28194 257/295 |
| 2008/0311732 A1* | 12/2008 | Dokumaci | H01L 21/2254 438/525 |
| 2010/0155716 A1 | 6/2010 | Cheong et al. | |
| 2011/0108861 A1* | 5/2011 | Smith | H01L 33/20 257/88 |
| 2011/0269287 A1* | 11/2011 | Tsai | H01L 21/2254 438/306 |
| 2011/0309333 A1* | 12/2011 | Cheng | B82Y 10/00 257/24 |
| 2012/0252197 A1* | 10/2012 | Clark | H01L 21/2254 438/559 |
| 2013/0115763 A1* | 5/2013 | Takamure | H01L 21/02129 438/513 |
| 2014/0091375 A1 | 4/2014 | Kao et al. | |
| 2015/0179414 A1* | 6/2015 | Xiao | C23C 16/01 216/46 |
| 2015/0243739 A1* | 8/2015 | Chen | H01L 29/7851 257/623 |
| 2015/0372144 A1* | 12/2015 | Fang | H01L 29/7851 257/192 |
| 2016/0056156 A1* | 2/2016 | Ghani | H01L 21/823821 257/401 |

* cited by examiner

ETCHING PROCESS

BACKGROUND

Semiconductor fabrication methods regularly utilize various types of etching processes. One type of etching process is a dry etching process. A dry etching process uses bombardment of ions from reactive gases to remove material from exposed surfaces. Another type of etching process is a wet etching process. A wet etching process uses a chemical solution to remove exposed material.

Another process regularly used in semiconductor fabrication methods is a doping process. The doping process involves injecting dopants into a semiconductor material to change the electrical properties of the semiconductor material. One way to perform a doping process is to deposit a thin layer of doping oxide onto the substrate. The doping oxide includes the desired type of dopants. Then, an annealing process is performed that causes the dopants of the doping oxide layer to diffuse into the substrate. Thus, The doping oxide layer acts as a solid diffusion source.

The doping oxide layer is typically patterned so that only the appropriate regions of the underlying substrate are doped. Patterning the doping oxide layer involves use of a patterning layer, such as a photoresist layer, and an etching process to remove exposed portions of the doping oxide layer. Using a dry etching process can damage the underlying substrate. Using a wet etching process can cause lateral etching of the doping oxide layer beyond the sidewalls of the patterning layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
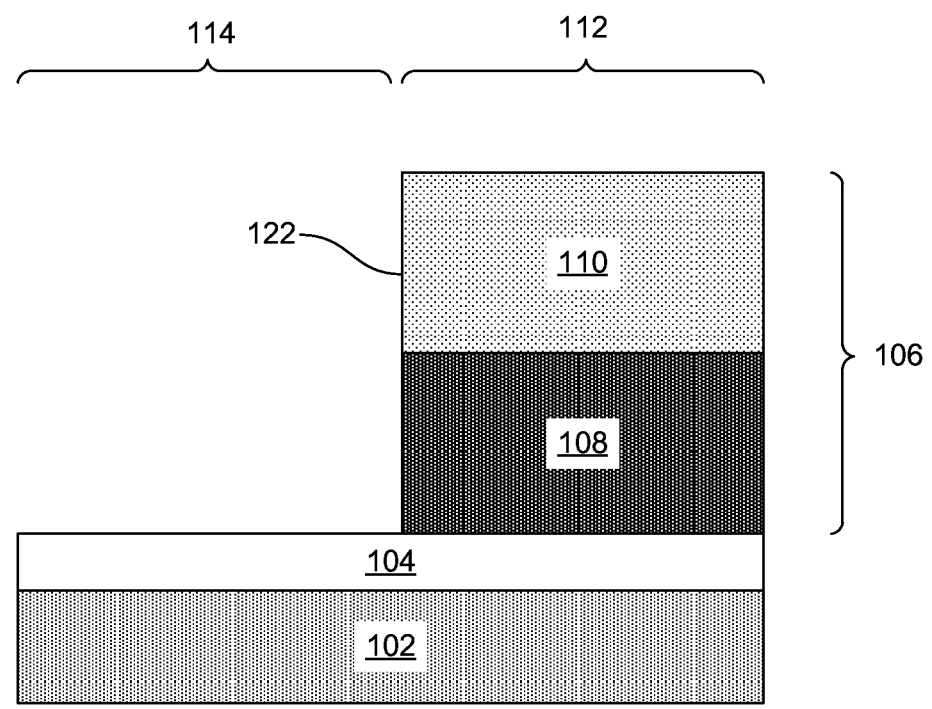
FIGS. 1A-1C are diagrams showing an illustrative improved wet etching process, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, using a dry etching process can damage the underlying substrate. Using a wet etching process can cause lateral etching of the doping oxide layer beyond the sidewalls of the patterning layer. But, according to principles described herein, an improved wet etching process can remove a doping oxide layer without causing too much lateral etching of the doping oxide beyond the patterning layer.

According to principles described herein, before applying a wet etching process, a soft sputtering process is performed to damage the exposed doping oxide layer. The damaged doping oxide layer can thus be more quickly removed by the wet etching process. By reducing the amount of time used for the wet etching process, there is less time for the doping oxide to be laterally etched beyond the patterning layer features. In some embodiments, a protective layer can be deposited onto the substrate before the sputtering process is performed. This also helps reduce the lateral etching and protects the sidewalls of the features of the patterning layer.

Figure 1B:
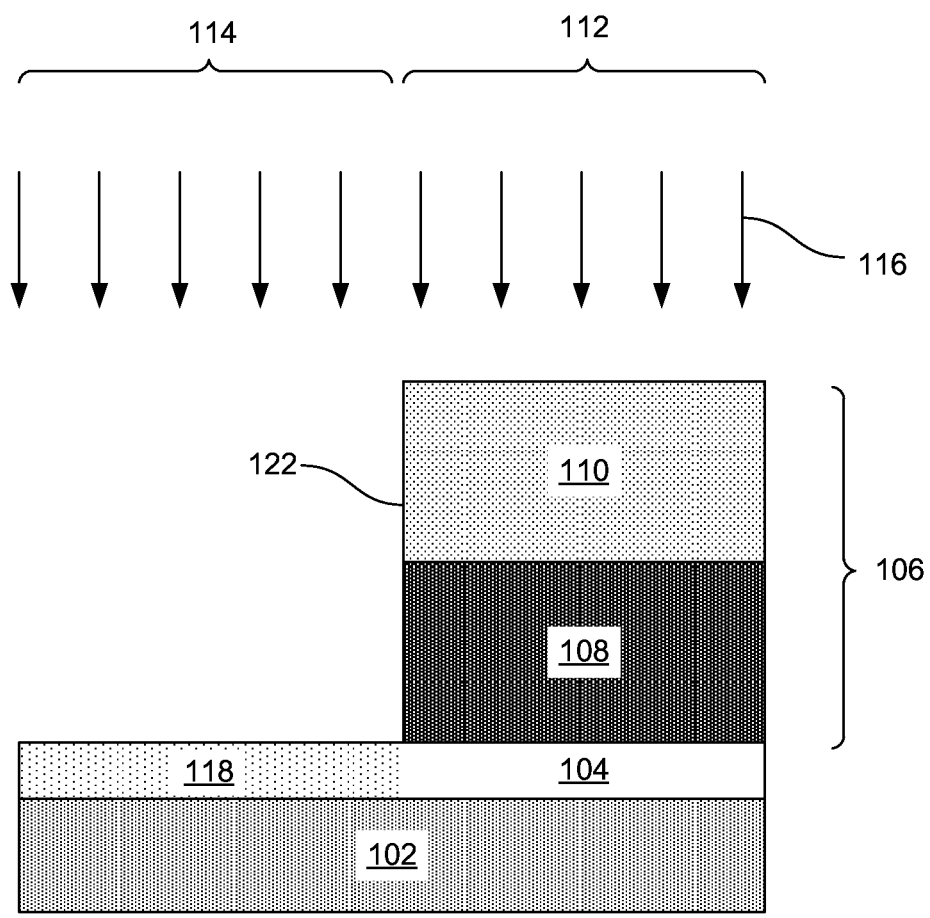
Figure 1C:
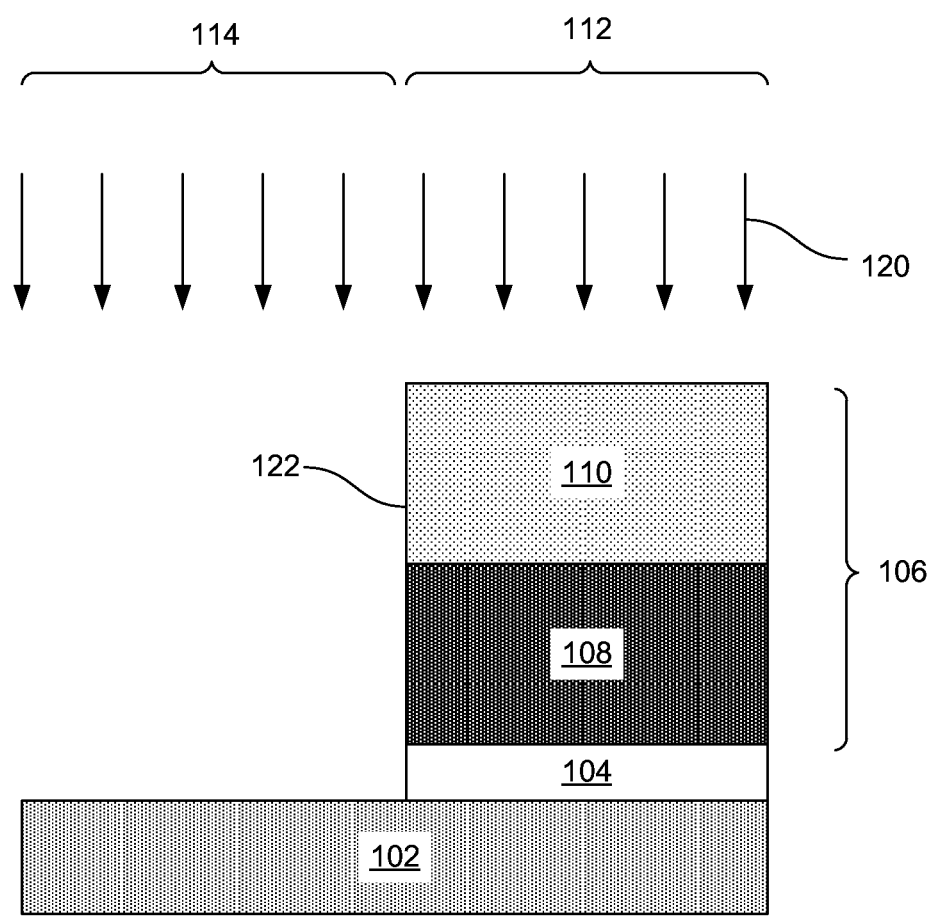

FIGS. 1A-1C are diagrams showing an illustrative method with an improved wet etching process, constructed with some embodiments. FIG. 1A illustrates a substrate 102, doping oxide layer 104, and patterning layer 106. According to the present example, a doping oxide 104 is formed on a substrate. A patterning layer 106 is then formed over the doping oxide. The patterning layer 106 is patterned such that there are exposed regions 114 and unexposed regions 112.

The substrate 102 may be a standard semiconductor wafer. For example, the wafer may be approximately 300 millimeters in diameter and less than one millimeter thick. The substrate 102 may be made of a semiconductor material such as silicon. In some examples, other materials such as Germanium III-V semiconductor materials may be used for the substrate 102.

The doping oxide layer 104 is deposited onto the surface of the substrate 102. The doping oxide may be made of a variety of materials including silicon dioxide ($SiO_2$), Arsenic Trioxide ($As_2O_3$), phosphosilicate glass (PSG), borosilicate glass (BSG). The doping oxide layer acts as a solid diffusion source for dopants. A dopant species within the doping oxide layer 104 will diffuse into the underlying substrate 102 under certain conditions. For example, a thermal annealing process, which involves high temperatures, can cause the dopant species to diffuse from the doping oxide layer 104 into the underlying substrate 102, thereby doping the substrate 102. In some examples, the doping oxide layer 104 has a thickness within a range of 10-20 angstroms.

Fabrication of integrated circuits generally involves doping specific regions on a semiconductor wafer in order to form specific features. For example, certain regions on the wafer may be doped to form source or drain regions for field-effect transistors or other proper circuit devices. Thus, the doping oxide layer 104 is patterned so that the doping oxide layer is removed from regions where the substrate or underlying features are not intended to be doped.

To pattern the doping oxide layer, a patterning layer 106 is formed on the doping oxide layer 104. In some embodiments, the patterning layer includes a photoresist layer 110 that is sensitive to photons and being capable of being patterned by a photolithography process. In one example, the patterning layer includes a bottom anti-reflective coating (BARC) layer 108 and a photoresist layer 110. The BARC layer is used to aid the exposure of the resist layer to a light source. Specifically, the BARC layer allows for higher resolution because light from a light source passing through the photoresist layer 110 does not reflect and reach portions of the photoresist layer that are not intended to be exposed.

The photoresist layer 110 is designed to be altered in response to exposure to a light source. In the case of a positive-tone photoresist, portions of the photoresist that are exposed to light become soluble to a developing solution. In the case of a negative photoresist, portions of the photoresist that are exposed to light become insoluble to the corresponding developing solution. Development of the photoresist layer removes the soluble portions while leaving the insoluble portions intact. Thus, after development of the photoresist layer 110, the photoresist layer 110 is patterned to form the patterning layer with various openings. The doping oxide layer is uncovered (or exposed) within the openings of the patterning layer. Accordingly, there are exposed regions 114 and unexposed regions 112. An etching process can thus be performed such that the doping oxide layer 104 is removed from the exposed regions 114. In general, it is desirable that the doping oxide layer 104 not be laterally etched pass the sidewalls of the patterning layer 106.

In some embodiments, the photoresist layer 110 is exposed to a light source through a photomask. In some other embodiments, the patterning layer is other suitable resist material that is sensitive to other radiation, such as electron-beam, X-rays, charged particles or other suitable radiation beam. Accordingly, the resist layer is patterned by the corresponding lithography process, such as e-beam lithography process.

FIG. 1B illustrates a soft sputtering process 116 that is used to weaken the exposed portions of the doping oxide layer 104, thereby changing the etching resistance of the exposed portions of the doping oxide layer 104, relative to that of the unexposed portions of the doping oxide layer. Conventional sputtering involves ejecting material from a target onto a substrate for sputtering deposition. The soft sputtering process is employed in the present disclosure for treating and/or etching. In the present embodiment, the bias power is applied to provide the plasma a directional energy toward the substrate 102 for the intended treating and/or etching. Particularly, the bias power is applied such that the corresponding electric field is toward the substrate such that the ions in the plasma are directed toward the substrate. Furthermore, the soft sputtering is designed to treat the doping oxide layer 104 without damaging the semiconductor substrate. Accordingly, the plasma energy and the corresponding bias power are designed to be sufficient to effectively treat the doping oxide layer for reducing the etching resistance and to be weak enough without damaging to the semiconductor substrate. In some embodiments, the bias power is within a range of about 20-1000 volts (V) or 20-1000 W.

According to the present example, the sputter gas for the sputtering process 116 may be one of Argon (Ar), Helium (He), Nitrogen gas ($N_2$), Oxygen gas ($O_2$), or Hydrogen Gas ($H_2$). The sputter gas is provided to the processing chamber with a flow rate ranging from about 10 to about 1000 standard cubic centimeters per minute (sccm). The pressure in the processing chamber is maintained in a range of about 5-100 millitorr (mTorr). The source power may be within a range of about 100-2000 watts (W). The source power is applied to the sputter gas to generate plasma. The temperature of the chuck, such as an e-chuck may be within a range of about 0-120 degrees Celsius (C.).

According to one example, the sputtering process 116 can be performed in a dry etching tool as some dry etching tools have the capability of performing the sputtering process. During the soft sputtering process, the doping oxide layer 104 is treated by the plasma, thereby creating a weakened (or damaged) doping oxide layer 118 over the exposed region 114. This weakened material is more susceptible to an etching process.

FIG. 1C is a diagram showing an illustrative wet etching process 120 performed on the substrate 102. As described above wet etching involves use of a chemical solution designed to remove certain types of material while leaving other materials intact. Specifically, the patterning layer 106 functions as an etching mask to protect the unexposed portions of the doping oxide layer from etching.

In one example, the wet etching process includes application of a hydrofluoric acid (HF) solution for a time period within a range of about 30-60 seconds. In one example, the hydrofluoric acid may be an aqueous solution with 0.5% HF. Then, the etching process 120 involves application of an SC1 solution for a time period within a range of about 120-180 seconds. The SC1 material may have a ratio of 1 part deionized water, 0.1 parts aqueous $NH_4OH$ (ammonium hydroxide), and 5 parts aqueous $H_2O_2$ (hydrogen peroxide). Then, hydrofluoric acid may again be applied for a time period within a range of about 30-60 seconds. Such time periods are less than those used by conventional wet etching processes.

In some examples, the wet etching process may be performed at a slow rotation speed. In conventional wet etching process, the chuck that holds the semiconductor rotates, thus causing rotation of the wafer. The wafer typically rotates within a range of 300-800 rotations per minute (RPM). But, according to principles described herein, the wet etching process is performed at a slow rotation speed that is less than 100 RPM.

Usually, a wet etching process is substantially isotropic and has lateral etching to the unexposed portions, which changes the desired dimensions. In the disclosed method, because a portion of the doping oxide layer 104 has been damaged or weakened by the sputtering process 116, the etching rate of the exposed portions is greater than that of the unexposed portions. Due to the etching rate difference between the exposed portions and the unexposed portions of the doping oxide, the lateral etching bias is reduced or substantially eliminated.

In some cases, the substrate 102 may be part of an epitaxially grown structure such as a fin structure. In some cases, the substrate 102 may be a fin structure formed by a method other than epitaxy. By using methods described herein, the wet etching process is performed such that any damage to the fin structure is reduced while the doping oxide layer 104 is not etched substantially beyond the sidewalls 122 of the patterning layer 106.

Figure 2A:
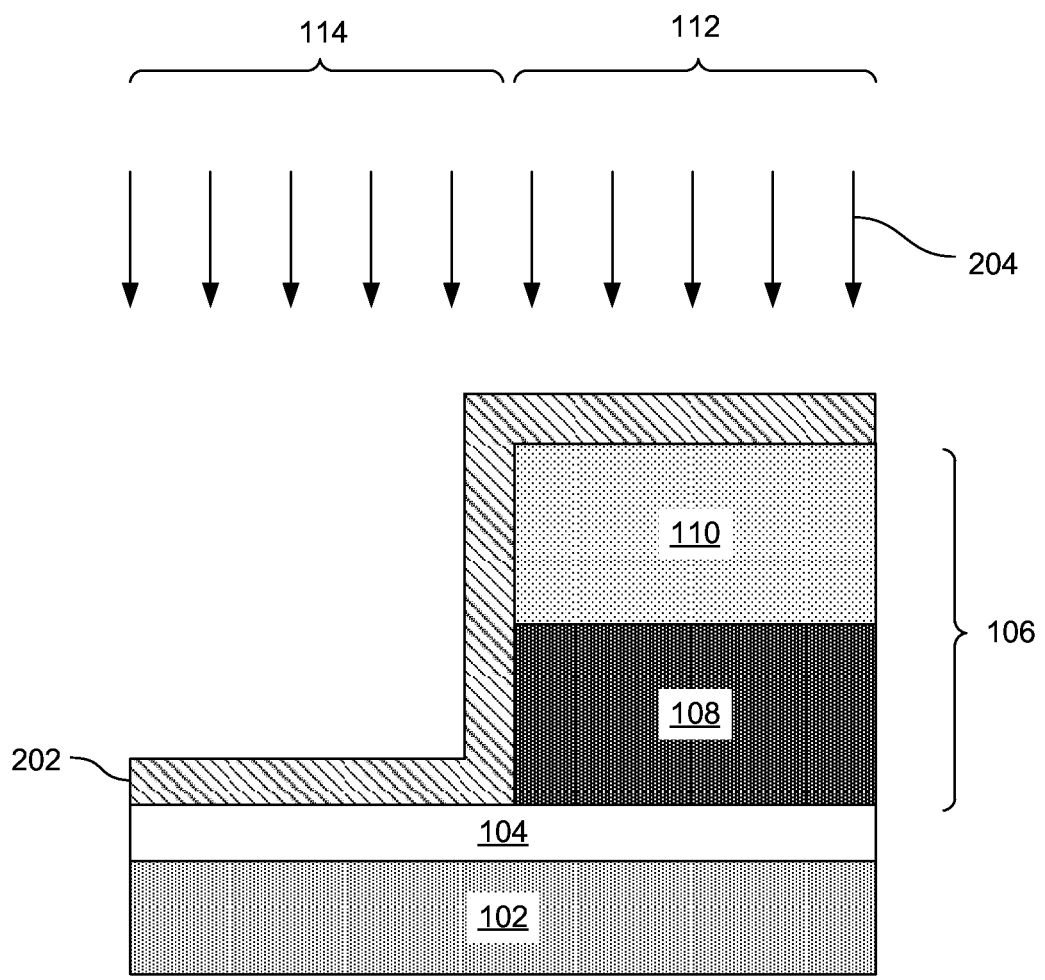
FIGS. 2A-2C are diagrams showing an illustrative improved wet etching process that utilizes a protective layer, according to one example of principles described herein.
Figure 2B:
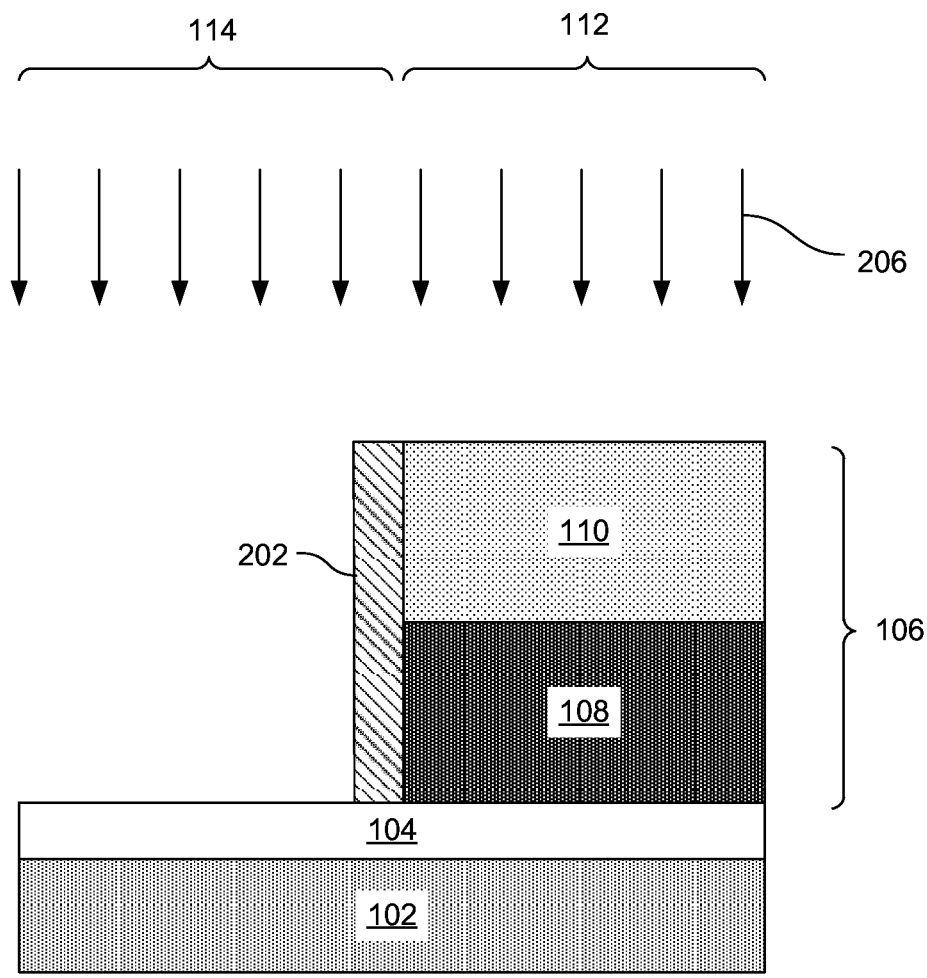
Figure 2C:
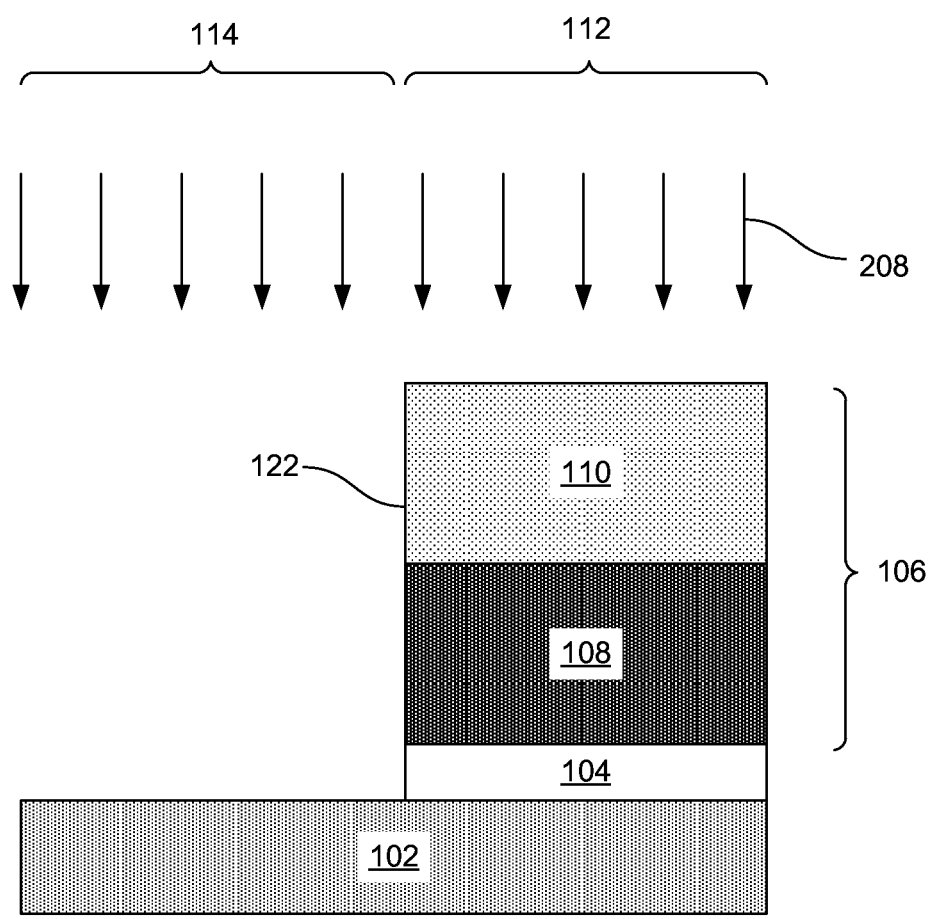

FIGS. 2A-2C are diagrams showing a method with an illustrative improved wet etching process that utilizes a protective layer, constructed in accordance with some embodiments. The protective layer may provide additional protection of the sidewalls of the patterning layer 106 during the wet etching process. FIG. 2A illustrates a deposition process 204 to form the protective layer 204. The protective layer 202 may be formed in a variety of different ways and may be made of a variety of materials. In some embodiments, the protective layer 202 is a polymer layer.

The protective layer 202 may be formed using a chemical vapor deposition (CVD) process. CVD is a chemical process that is often used in the semiconductor industry to produce thin layers of varying material. In a typical CVD process, the substrate is exposed to one or more volatile precursors. Such precursors react on the substrate surface to produce the desired deposition of material.

The CVD process used to produce the protective layer 202 may utilize a variety of precursors. For example, the precursors may include methane ($CH_4$), 1-Butene ($C_4H_8$), octafluorocyclobutane ($C_4F_8$), fluromethane ($CH_3F$) or $C_5F_8$. The CVD gases may flow at a rate within a range of 10-1000 sccm. In some embodiments, the CVD process further includes a carrier gas, such as argon (Ar) or helium (He). In some examples, helium (He) is provided with a respective gas flow rate within a range of 0-2000 sccm. In some embodiments, the pressure in the processing chamber is maintained at a pressure within a range of 5 and 100 millitorr during the deposition. In some examples, the source power may be within a range of 100-2000 W. The bias power may be within a range of 0-1000 V or 0-1000 W. The temperature of the chuck holding the wafer may have a temperature within a range of about 0-120 degrees C. The protective layer deposition process 204 may also be performed in the dry etch tool. In some examples, other methods, such as spin coating may be used to apply the protective layer 202.

In the present embodiment, the protective layer 202 is formed directly on the doping oxide layer 104, the sidewalls 122 of the patterning layer 106, and the top of the patterning layer 106. The protective layer 202 may be substantially uniform in thickness. In some embodiments, the material of the protective layer 202, such as a polymer, is selected so that it will be removed as a result of the sputtering process.

FIG. 2B illustrates a soft sputtering process 206 performed on the substrate, and thus to the protective layer 202. According to the present embodiment, the sputter gas for the sputtering process 206 may be one of Argon (Ar), Helium (He), Nitrogen gas ($N_2$), Oxygen gas ($O_2$), Hydrogen Gas ($H_2$) or a combination thereof.

The sputtering process can be tuned so that it removes the horizontal portions of the protective layer 202 while leaving the vertical portions of the protective layer 202 substantially intact. The horizontal portions include the portions of the protective layer 202 on the doping oxide 104 and on the patterning layer 106. The vertical portions include the protective layer 202 on the sidewalls 122 of the patterning layer 106. In some embodiments, the soft sputter process treats the exposed portion of the doping oxide layer 104 as well to reduce its etching resistance without damage to the substrate.

In some examples, the sputter gas may be provided with a flow rate within a range of about 10-1000 standard cubic centimeters per minute (sccm). In some examples, the processing chamber may be maintained at a pressure within a range of about 5-100 millitorr (mTorr). The source power may be within a range of about 100-2000 watts (W). The bias power may be within a range of about 20-1000 volts (V) or 20-1000 W. The temperature of the chuck, such as an E-chuck, that supports the substrate 102 may be within a range of about 0-120 degrees Celsius (C.).

FIG. 2C illustrates a wet etching process to remove the exposed portion of the doping oxide layer 104 and the remaining protective layer 202 on the sidewalls 122 of the patterning layer 106. In one example, the wet etching process 208 involves application of a hydrofluoric acid (HF) for a time period within a range of about 30-60 seconds. In one example, the hydrofluoric acid may be an aqueous solution with 0.5% HF. Then, the etching process 208 involves application of an SC1 solution for a time period within a range of about 120-180 seconds. The SC1 material may have a ratio of 1 part deionized water, 0.1 parts aqueous $NH_4OH$ (ammonium hydroxide), and 5 parts aqueous $H_2O_2$ (hydrogen peroxide). Then, hydrofluoric acid may again be applied for a time period within a range of about 30-60 seconds.

Because a protective layer 202 was in place along the sidewalls 122 of the patterning layer 106, lateral etching of the doping oxide layer 104 beyond the sidewalls 122 is reduced. Additionally, the sidewalls 122 are protective from the etching process. Additionally, because a portion of the doping oxide layer 104 has been treated by the sputtering process 116, the etching resistance of the exposed portions of the doping oxide layer is reduced. Due to the etching rate difference between the exposed portions and the unexposed portions, the lateral etching bias is further reduced.

Figure 3:
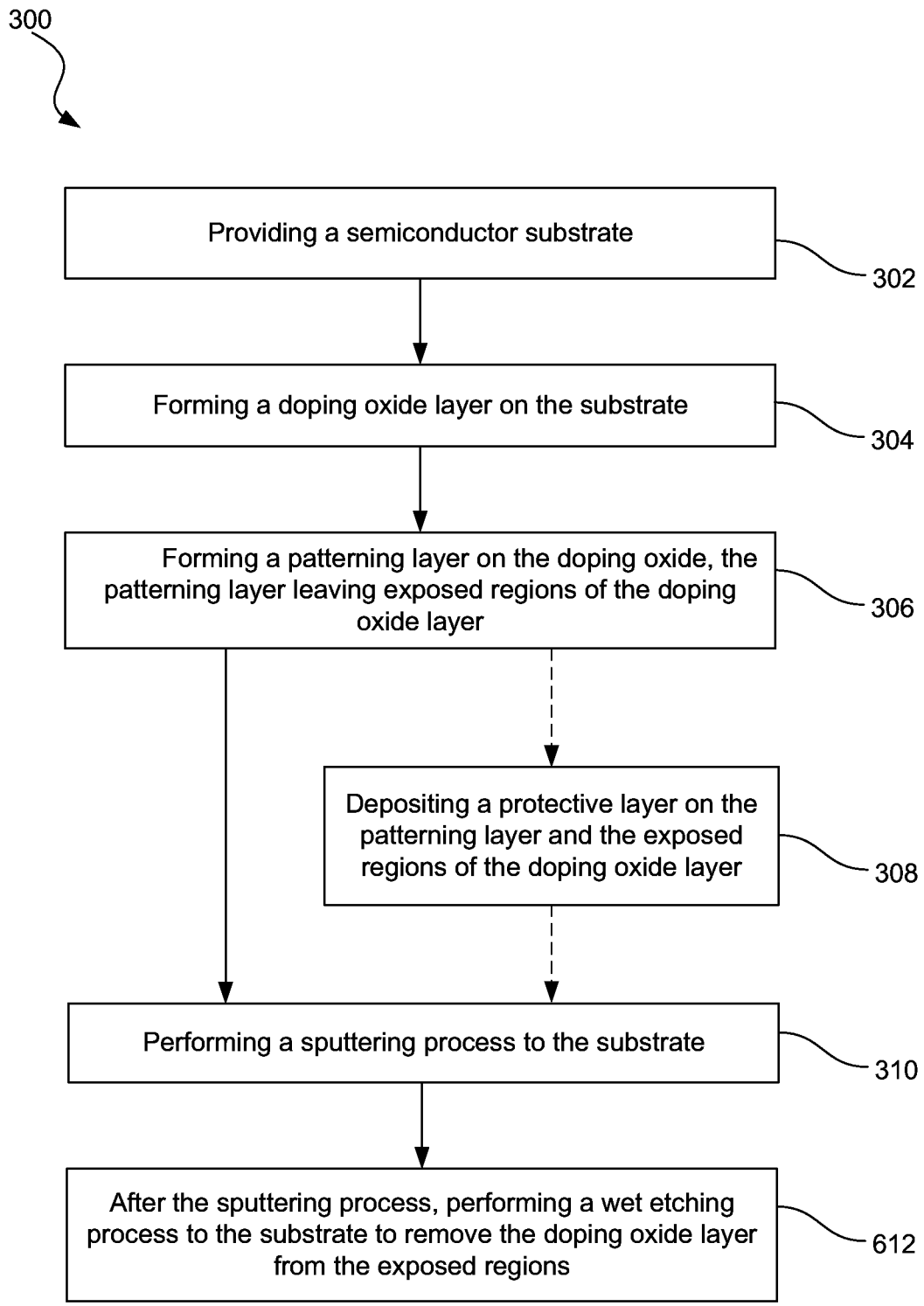
FIG. 3 is a flowchart showing an illustrative method for performing an improved wet etching process, according to one example of principles described herein.

FIG. 3 is a flowchart showing an illustrative method for performing an improved wet etching process. According to the present example, the method 300 includes an operation 302 for providing a semiconductor substrate. The substrate may be a standard semiconductor wafer used to manufacture integrated circuits. The substrate may be secured to a chuck such as an e-chuck during various fabrication processes.

The method 300 further includes an operation 304 for forming a doping oxide layer on the substrate. As described above, a doping oxide layer acts as a solid diffusion source for doping the substrate. Under certain conditions such as high temperatures, dopants from the doping oxide will diffuse into the underlying substrate. The doping oxide layer may be used to achieve a desired doping profile.

The method 300 further includes an operation 306 for forming a patterning layer on the doping oxide layer. The patterning layer is formed by a lithography process and includes various openings that define exposed regions and unexposed regions of the doping oxide layer. The patterning layer may include a resist material. In some examples, a BARC layer is deposited before depositing the photoresist material. The patterning layer is then exposed according to an IC pattern defined on a photomask or in a database. After development of the patterning layer, the patterning layer is formed. The patterning layer covers the unexposed regions of the doping oxide layer while the unexposed regions of the doping oxide layer are covered. The regions that are covered correspond to regions where doping is intended to occur with the doping species of the doping oxide layer. In some examples, the covered regions may correspond to fin structures or portions of fin structures that are intended to be doped.

The method 300 may further include an operation 308 for depositing a protective layer on the patterning layer and the exposed regions of the doping oxide layer. In some embodiments, this step is skipped. The protective layer may be a polymer material. The protective layer may be formed through use of a dry etching tool. The protective layer may be formed using a CVD process. The protective layer may also be performed using a spin coating process. In some examples, the protective layer is formed on sidewalls of the patterning layer as well as on top of the patterning layer and on top of the doping oxide layer.

The CVD process used to produce the protective layer may utilize a variety of precursors. For example, the precursors may include methane ($CH_4$), 1-Butene ($C_4H_8$), octafluorocyclobutane ($C_4F_8$), fluromethane ($CH_3F$) or $C_5F_8$. The CVD gases may flow at a rate within a range of 10-1000 sccm. The gases may flow with or without argon (Ar). In some examples, there may be a helium (He) dilution having a flow rate within a range of 0-2000 sccm. The gases may be pressurized to a pressure within a range of 5 and 100 millitorr. In some examples, the source power may be within a range of 100-2000 W. The bias power may be within a range of 0-1000 V or 0-1000 W. The temperature of the chuck holding the wafer may have a temperature within a range of about 0-120 degrees C. The protective layer deposition process 204 may also be performed in the dry etch tool. In some examples, other methods, such as spin coating may be used to apply the protective layer.

The method 300 further includes an operation 310 for performing a soft sputtering process to the substrate. Thus, the soft sputtering process affects all exposed materials on the substrate. For example, if there is a protective layer in place, the sputtering process affects all regions of the protective layer. The soft sputtering process has anisotropic etching effect and causes removal of the patterning layer on top of the doping oxide layer and on top of the patterning layer. But, the sputtering process will leave the protective layer on the sidewalls of the patterning layer substantially intact.

In some examples, the soft sputter gas for the sputtering process may be one of Argon (Ar), Helium (He), Nitrogen gas ($N_2$), Oxygen gas ($O_2$), or Hydrogen Gas ($H_2$). The sputter gas may flow at a rate within a range of about 10-1000 standard cubic centimeters per minute (sccm). The pressure in the processing chamber is maintained at a pressure within a range of about 5-100 millitorr (mTorr). The source power may be within a range of about 100-2000 watts (W). The bias power may be within a range of about 20-1000 volts (V) or 20-1000 W. This may be done by applying the power to the chuck that supports the substrate. The temperature of the chuck, such as an e-chuck may be within a range of about 0-120 degrees C. In some embodiments, the operations 308 and 310 are both implemented in a same dry etching tool, thus reducing the contamination therebetween and enhancing the fabrication throughput.

With or without the protective layer in place, the sputtering process can weaken the exposed doping oxide layer, thus making it more susceptible to the wet etching process that will be described below. This makes it so that the wet etching process can be performed with an anisotropic etching effect. Because the etching rate difference between the exposed and unexposed portions of the doping oxide layer, the lateral etching bias during the wet etching process is eliminated or reduced.

The method 300 further includes an operation 312 for performing a wet etching process to the substrate to remove the doping oxide layer from the exposed regions. Because the soft sputtering process has treated the exposed doping oxide layer, the wet etching rate of the exposed portions is reduced. This results in less lateral etching of the doping oxide layer beyond the sidewalls of the patterning layer. This allows for the final pattern of the doping oxide layer to be more precise. In some examples, the wet etching process is performed at slower rotation speeds than conventional wet etching processes. If the protective layer was used, then the protective layer on the sidewalls of the patterning layer will also help reduce the lateral etching and protects the sidewall of the patterning layer from the etching loss.

In one example, the wet etching process involves application of a hydrofluoric acid (HF) solution for a time period within a range of about 30-60 seconds. In one example, the hydrofluoric acid may be an aqueous solution with 0.5% HF. Then, the etching process 120 involves application of an SC1 solution for a time period within a range of about 120-180 seconds. The SC1 material may have a ratio of 1 part deionized water, 0.1 parts aqueous $NH_4OH$ (ammonium hydroxide), and 5 parts aqueous $H_2O_2$ (hydrogen peroxide). Then, hydrofluoric acid may again be applied for a time period within a range of about 30-60 seconds. Such time periods are less than those used by conventional wet etching processes.

After the doping oxide layer has been removed from the regions exposed by the patterning layer, the patterning layer may be removed. This leaves specific regions of doping oxide material on the substrate. Then, an annealing process can be applied. The high temperatures of the annealing process will cause dopants from the doping oxide to migrate into the underlying substrate. Thus, the regions that were originally covered by the patterning layer become the regions where the underlying substrate is doped.

In accordance with some embodiments, a method includes providing a semiconductor substrate; forming a doping oxide layer on the semiconductor substrate; forming a patterning layer on the doping oxide layer, the patterning layer leaving exposed regions of the doping oxide layer; performing a sputtering process to the substrate; and after the sputtering process, performing a wet etching process to the semiconductor substrate to remove the doping oxide layer from the exposed regions.

In accordance with some embodiments, a method includes forming a doping oxide layer on a substrate; forming a patterned resist layer on the doping oxide layer, the patterned resist layer leaving regions of the doping oxide layer exposed; performing a soft sputtering process on the substrate such that the doping oxide layer in the exposed regions is weakened; and after the soft sputtering process, performing a wet etching process to remove the doping oxide layer from the exposed regions.

In accordance with some embodiments, a method includes forming a doping oxide layer on a semiconductor substrate; forming a patterning layer on the doping oxide, the patterning layer leaving exposed regions of the doping oxide layer; depositing a protective layer on the patterning layer and the exposed regions of the doping oxide layer; after depositing the protective layer, performing a sputtering process to the semiconductor substrate, thereby removing portions of the protective layer within the exposed regions; and after the sputtering process, performing a wet etching process to the substrate to remove the protective layer and the doping oxide layer from the exposed regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a semiconductor substrate;
    forming a doping oxide layer on the semiconductor substrate;
    forming a patterning layer on the doping oxide layer, the patterning layer leaving exposed regions of the doping oxide layer;
    performing a sputtering process to the substrate;
    after the sputtering process, performing a wet etching process to the semiconductor substrate to remove the doping oxide layer from the exposed regions; and
    after performing the wet etching process, removing the patterning layer to expose the doping oxide layer.

2. The method of claim 1, further comprising, before performing the sputtering process, forming a protective layer on the patterning layer and the exposed regions of the doping oxide layer.

3. The method of claim 2, wherein forming the protective layer comprises forming a polymer layer by using of at least one of: $CH_4$, $C_4H_8$, $CH_3F$, $C_4F_8$, and $C_5F_8$.

4. The method of claim 2, wherein
    the forming of the protective layer includes forming the polymer layer in a dry etching tool; and
    the sputtering process is performed in the dry etching tool.

5. The method of claim 4, wherein the sputtering process removes portions of the polymer layer on the doping oxide layer within the exposed regions, thereby leaving the polymer layer on sidewalls of the patterning layer.

6. The method of claim 2, wherein the protective layer is formed with a spin coating process.

7. The method of claim 1, wherein a sputtering gas for the sputtering process comprises at least one of: Ar $N_2$, He, $O_2$, and $H_2$.

8. The method of claim 1, wherein a gas pressure of a sputtering gas used for the sputtering process is within a range of about 5-100 millitorr.

9. The method of claim 1, wherein a source power for the sputtering process is within a range of about 100-2000 watts and a bias voltage is within a range of about 20-1000 volts.

10. The method of claim 1, wherein the wet etching process is performed at a rotation speed less than 100 rotations per minute.

11. The method of claim 1, wherein the wet etching process comprises hydrofluoric acid for about 30-60 seconds, a cleaning material for about 120-180 seconds, and hydrofluoric acid for about 30-60 seconds.

12. The method of claim 1, further comprising
    performing a thermal process, thereby introducing doping species from the doping oxide layer to the semiconductor substrate within the exposed regions.

13. The method of claim 1, wherein the exposed regions of the semiconductor substrate correspond to a portion of a fin Field Effect Transistor (FinFET) device.

14. The method of claim 1, wherein the patterning layer comprises a bottom anti-reflective coating (BARC) material and a resist material.

15. A method comprising:
    forming a doping oxide layer on a substrate;
    forming a patterned resist layer on the doping oxide layer, the patterned resist layer leaving regions of the doping oxide layer exposed;
    performing a soft sputtering process on the substrate such that the doping oxide layer in the exposed regions is weakened;
    after the soft sputtering process, performing a wet etching process to remove the doping oxide layer from the exposed regions; and
    after performing the wet etching process, removing the patterning layer to expose the doping oxide layer.

16. The method of claim 15, further comprising, before performing the soft sputtering process, depositing a protective layer on the patterned resist layer, including sidewalls of features of the patterned resist layer, and the exposed regions of the doping oxide layer.

17. The method of claim 15, wherein
    the soft sputtering process is applied to the doping oxide layer in the exposed regions such that its etch resistance is reduced; and
    the wet etching process selectively etches the doping oxide layer in the exposed regions such that the doping oxide layer is not laterally etched substantially beyond sidewalls of features of the patterned resist layer.

18. A method comprising:
    forming a doping oxide layer on a semiconductor substrate;
    forming a patterning layer on the doping oxide, the patterning layer leaving exposed regions of the doping oxide layer;
    depositing a protective layer on the patterning layer and the exposed regions of the doping oxide layer;
    after depositing the protective layer, performing a sputtering process to the semiconductor substrate, thereby removing portions of the protective layer within the exposed regions;
    after the sputtering process, performing a wet etching process to the substrate to remove the protective layer and the doping oxide layer from the exposed regions; and
    after performing the wet etching process, removing the patterning layer to expose the doping oxide layer.

19. The method of claim 18, wherein depositing the protective layer and performing the sputtering process are performed in a dry etching tool.

20. The method of claim 18, wherein the performing of the sputtering process includes performing the sputtering process to reduce etching resistance of the doping oxide layer within the exposed regions.

* * * * *